United States Patent [19]

Kojima et al.

[11] Patent Number: 5,242,264

[45] Date of Patent: Sep. 7, 1993

[54] MACHINE ON GROUND PROVIDED WITH HEAT RESISTANT WALL USED FOR ISOLATING FROM ENVIRONMENT AND HEAT RESISTANT WALL USED THEREFOR

[75] Inventors: Yoshitaka Kojima, Hitachi; Noriyuki Ohnaka, Katsuta; Shizuka Yamaguchi, Katsuta; Shoichi Nakashima, Hitachi; Sai Ogawa, Tohkai; Masayuki Doi, Katsuta; Seishin Kirihara, Hitachi, all of Japan

[73] Assignee: Hitachi, Ltd., Tokyo, Japan

[21] Appl. No.: 564,344

[22] Filed: Aug. 8, 1990

[30] Foreign Application Priority Data

Aug. 30, 1989 [JP] Japan .................. 1-221474

[51] Int. Cl.⁵ .................. F01D 1/02; F04D 29/44
[52] U.S. Cl. .................. 415/200; 415/115; 416/241 R; 428/216; 428/408; 428/426; 428/432; 428/446; 428/212; 428/213; 428/698; 428/701
[58] Field of Search .............. 428/633, 408, 698, 216, 428/432, 426, 701, 446, 213, 212; 415/200, 115; 416/241

[56] References Cited

U.S. PATENT DOCUMENTS

| 3,019,128 | 1/1962 | Smiley | 428/446 |
|---|---|---|---|
| 3,925,577 | 12/1975 | Fatzer et al. | 428/446 |
| 4,247,249 | 1/1981 | Siemers | 415/200 |
| 4,269,903 | 5/1981 | Clingman et al. | 428/633 |
| 4,321,310 | 3/1982 | Ulion et al. | 428/633 |
| 4,335,190 | 6/1982 | Bill et al. | 428/633 |
| 4,425,407 | 1/1984 | Galasso et al. | 428/408 |
| 4,461,806 | 7/1984 | Ikeda et al. | 428/432 |
| 4,465,777 | 8/1984 | Shuford | 428/408 |
| 4,472,476 | 9/1984 | Veltri et al. | 428/215 |
| 4,476,178 | 10/1984 | Veltri et al. | 428/408 |
| 4,495,907 | 1/1985 | Kamo | 428/472 |
| 4,500,602 | 2/1985 | Patten et al. | 428/698 |
| 4,515,860 | 5/1985 | Holzz | 428/408 |
| 4,541,776 | 9/1985 | Schön | 415/109 |
| 4,567,874 | 3/1986 | Spengler et al. | 428/623 |
| 4,582,751 | 4/1986 | Vasilos et al. | 428/408 |
| 4,585,675 | 4/1986 | Smuford | 428/408 |
| 4,599,256 | 7/1986 | Vasilos | 428/408 |
| 4,609,562 | 9/1986 | Isenberg et al. | 118/692 |
| 4,610,896 | 9/1986 | Veltri et al. | 427/140 |
| 4,671,997 | 6/1987 | Galasso et al. | 428/698 |
| 4,774,150 | 9/1988 | Amano et al. | 415/118 |
| 4,795,677 | 1/1989 | Gray | 428/408 |
| 4,863,773 | 9/1989 | Rousseau et al. | 428/408 |
| 4,868,056 | 9/1989 | Haskelkorn | 428/698 |
| 4,880,614 | 11/1989 | Strangman et al. | 428/633 |
| 4,892,790 | 1/1990 | Gray | 428/408 |

FOREIGN PATENT DOCUMENTS

| 359614 | 3/1990 | European Pat. Off. . |
| 2546878 | 12/1984 | France . |
| 8400924 | 3/1984 | PCT Int'l Appl. . |
| 2062115 | 5/1981 | United Kingdom . |

Primary Examiner—A. A. Turner
Attorney, Agent, or Firm—Antonelli, Terry, Stout & Kraus

[57] ABSTRACT

The disclosure is concerned with a thermal land machine which comprises a heat resistant wall for confining a chamber; a heat resistant composite structure disposed in the chamber and in contact with a hot flowing gas; and an apparatus for introducing the hot gas toward the surface of the composite structure. The composite structure including a heat resistant substrate and a continuous refractory coating formed on the substrate and made of a ceramic material. The refractory coating includes at least two layers in a laminated structure each having fine cracks substantially extended in the direction of the thickness of each of the layers and filled with a refractory material in such a manner that the filled cracks in one layer are disconnected with the filled cracks in the adjacent layer. Therefore, the hot gas cannot permeate into the surface of the substrate.

12 Claims, 6 Drawing Sheets

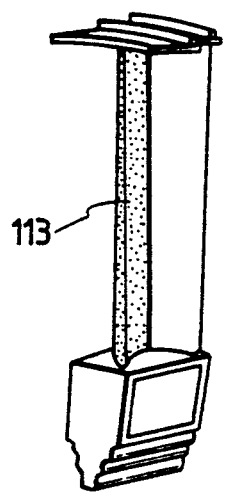
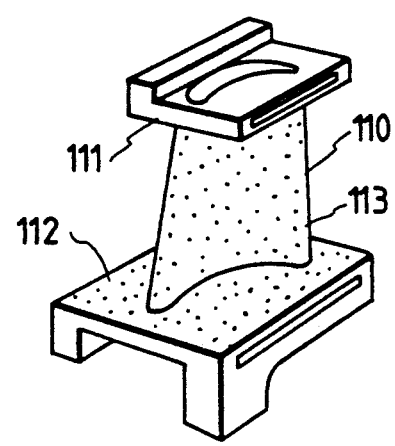
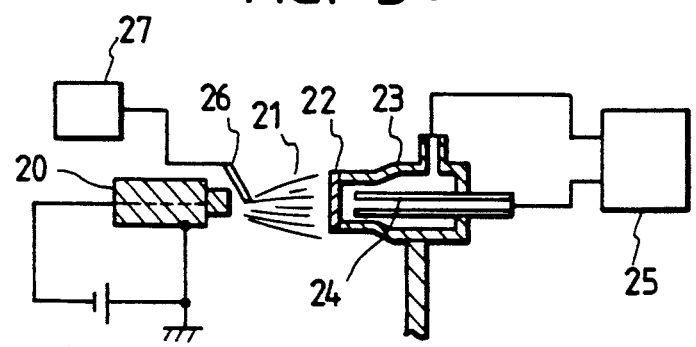
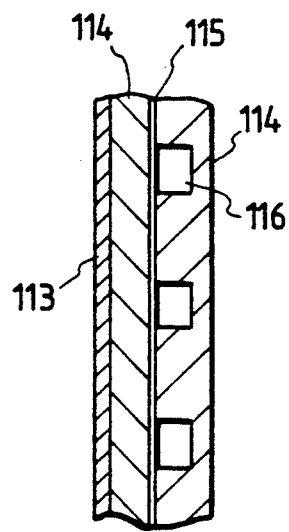
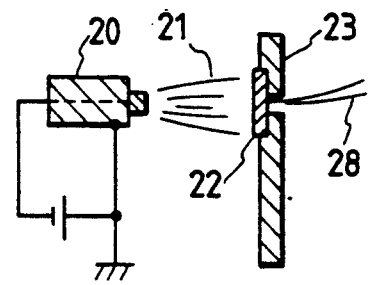

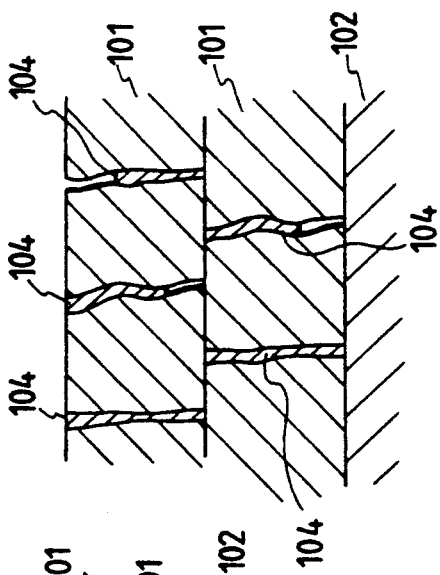
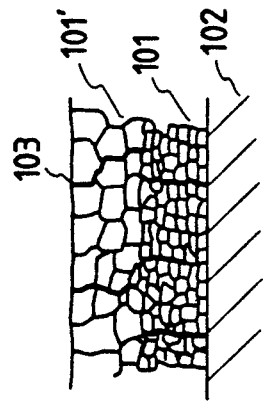
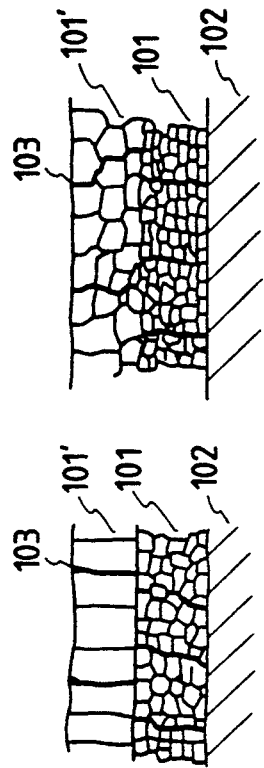
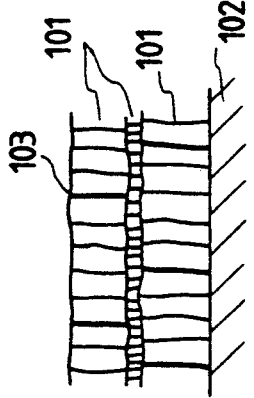
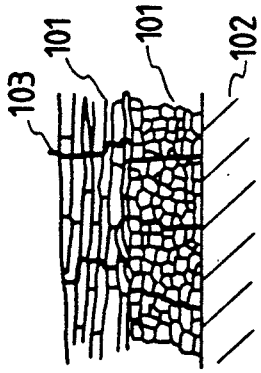
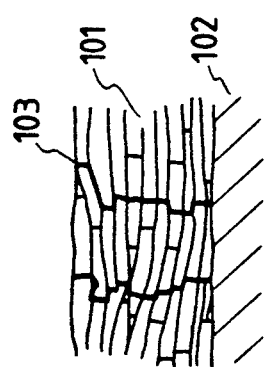
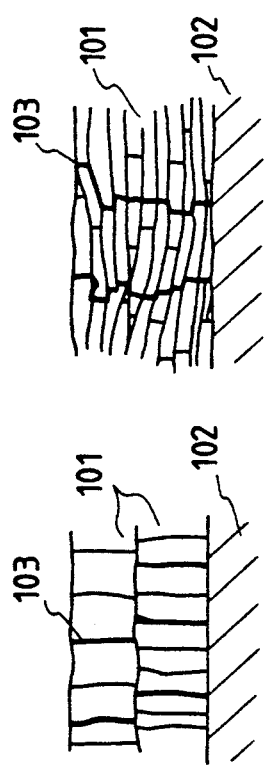
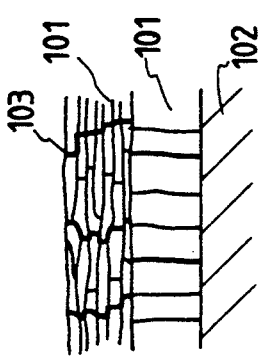

MACHINE ON GROUND PROVIDED WITH HEAT RESISTANT WALL USED FOR ISOLATING FROM ENVIRONMENT AND HEAT RESISTANT WALL USED THEREFOR

FIELD OF THE INVENTION

The present invention relates to a machine on the ground, in other words a thermal land machine, having a base member and a heat resistant wall used for isolating from an environment formed by covering, or coating, a material having a different thermal expansion with the base member on the surface of the base member, and a heat resistant wall used for isolating from an environment used therefor.

EXPLANATION OF PRIOR ART

There are many uses and a variety of industrial demands on a heat resistant member used for isolating from an environment which aims to prevent a base member from being exposed to a specific high temperature environment by covering the surface of the base member with a material having a different thermal expansion with the base member. In particular, when the member is exposed to a high temperature, the covering layer is damaged due to a thermal stress caused by a thermal expansion difference between the base member and the covering layer, and the isolation property from the environment which is a primary object of the covering layer sometimes can not be sufficiently achieved. Accordingly, the conventional prior art covering layer as disclosed in JP-A-62-156938(1987) employed a measure in which a thermal stress caused in the covering layer was reduced and damages caused in the covering layer was reduced. In this measure for example, the composition of the covering layer was successively changed from the surface of the base member to the surface of the covering layer so as to locate the maximum thermal stress point inside the covering layer, in other words so as not to locate the maximum thermal stress point such as at the surface of the covering layer which is likely to be a starting point of the damage in the covering layer, and at the boundary portion between the covering layer and the base member, thereby damage in the covering layer was small.

However, the member provided with such covering layer has such problems as diffusion and reaction of compounds and metal materials under a high temperature condition, diffusion and reaction of the compounds and materials constituting the base member, and expansion of gas constituents in internal defects in the covering layer, a status change of the covering layer was caused during the use under a high temperature and an additional new stress was induced to damage the covering layer.

On one hand, JP-A-62-182263 discloses a technique of forming an anticorrosion ceramic layer by repeating sealing treatment of microscopic holes in plasma flame spray film.

When this measure is employed and the film is formed under a lower temperature than an operating temperature of the member, new cracks are generated in the member due to thermal stress during the use thereof under a high temperature, serve as starting points and proceed oxidation of the base member. On the other hand, when the film is formed under a higher temperature than the operating temperature of the member, cracks are generated in the covering layer due to thermal stress after the formation of the covering layer. Likely, "Experimental model test on a combustor of carbon composite material used for a low thrust storeable propellant engine" (Technical Report of National Aerospace Laboratory TR-946, October, 1987) indicates filling of micro cracks which are generated in SiC coating formed on C/C base material by applying tetraethyl orthosilicate and by heat treating at a predetermined temperature.

Other than above JP-A-63-38565 (1988) discloses a technique in which cracks are formed beforehand by irradiating a ceramic film with laser beam to relax stress.

Further, JP-A-56-54905 (1981) and JP-A-58-16094 (1983) indicates measures in which a stress relaxation is achieved through formation of many microscopic cracks by heat treating a ceramic layer on a metal base. All of these measures are effective for stress relaxation, however they are insufficient for protecting the base material from a corrosion environment.

In the above mentioned conventional member having a controlled thermal stress structure by continuously changing the composition thereof, the status change (such as diffusion and reaction) of the material was not taken into consideration when used under a high temperature condition so that a new stress was generated due to these changes to damage a part of the material. Further, in a single covering layer of which composition was not controlled and when the covering layer was formed with a CVD (Chemical Vapor Deposition) method at a high temperature, problems have arisen in that, cracks were generated in the covering layer after the film formation by a thermal stress due to a thermal expansion difference between the base member and the covering layer and developed from the tips of the cracks to damage the base member under a high temperature condition for a long time or under thermal load cycles repeating a high temperature heating.

Further, when low temperature film forming method such as flame spraying were employed and the member was used under a high temperature condition, the covering layer was damaged by a thermal stress due to a thermal expansion difference between the covering layer and the base member and the damaged parts as starting points developed to lead the covering layer to failure.

SUMMARY OF THE INVENTION

An object of the present invention is to provide, in a machine on the ground including a heat resistant wall used for isolating from an environment in which on the surface of a heat resistant base member is disposed a refractory covering layer having a thermal expansion different from that of the heat resistant base member, with a heat resistant wall used for isolating from an environment including a covering layer with a high reliability having both features of thermal stress relaxation action and of an isolation property from an environment in the covering layer.

The above object is achieved in a machine on the ground provided with a heat resistant wall used for isolating from an environment in which a portion exposed to a high temperature includes a refractory coating layer used for isolating from the environment formed on a substrate composed of a heat resistant material, by providing such a heat resistant wall for isolating from the environment including a crack which is produced in the coating layer by exposing thereof beforehand to a higher temperature than a forming temperature thereof due to a thermal expansion difference between the coating layer and the substrate; and a refractory filler filled within the crack.

The present invention is to provide a thermal land machine which comprises a heat resistant wall confining a chamber; a heat resistant composite structure disposed in the chamber and in contact with a hot gas of a temperature higher than 1200° C.; and a passage for conducting the hot gas toward the surface of the composite structure, wherein the composite structure comprises a heat resistant substrate and a continuous refractory coating formed on the substrate and made of a ceramic material, characterized in that the refractory coating has fine cracks the direction of which is substantially extended in the direction of the thickness of the coating and which are filled with a refractory filling material in such a manner that a permeation of the hot gas into the surface of the substrate is substantially prevented, wherein the fine cracks have been formed by heating the coating to a temperature higher than the temperature for forming the coating, prior to the filling.

In the above thermal land machine, intermediate bonding layer is preferably formed between the substrate and the refractory coating so as to increase the bonding strength of the coating to the substrate.

Further in the above thermal land machine the substrate is preferably made of a sintered material comprising carbon fibers and carbon powder which has substantially an inclined arrangement of the density of the carbon fibers in the direction of the thickness of the substrate.

Still further in the above thermal land machine, a preferable refractory filling material is of a ceramic material having a melting point higher than 1700° C. and is selected from the group consisting of carbides, nitrides and oxides of refractory metals.

Another aspect of the present invention is to provide a thermal land machine which comprises a heat resistant wall for confining a chamber; a heat resistant composite structure disposed in the chamber and in contact with a hot flowing gas of a temperature higher than 1500° C., and means for introducing the hot gas toward the surface of the composite structure, wherein the composite structure comprises a heat resistant substrate and a continuous refractory coating formed on the substrate and made of a ceramic material, characterized in that the refractory coating comprises at least two layers in a laminated structure each having fine cracks substantially extended in the direction of the thickness of each of the layers and filled with a refractory material in such a manner that the filled cracks in one layer are disconnected with the filled cracks in the adjacent layer.

In the above thermal land machine, the refractory filling material is preferably of a ceramic material having a melting point higher than 1800° C. and is selected from the group consisting of carbides, nitrides and oxides of refractory metals.

A feature of the present invention resides in a heat resistant composite structure for use in the thermal land machine, wherein the composite structure comprises a heat resistant substrate and a continuous refractory coating formed on the substrate and of a ceramic material, the refractory coating has fine cracks which are substantially extended in the direction of the thickness of the coating and are filled with a refractory filling material in such a manner that a permeation of the hot gas into the surface of the substrate is substantially prevented.

In a still another aspect of the present invention, a feature of the present invention resides in a heat resistant composite structure for use in the thermal land machine which comprises a heat resistant substrate and a continuous refractory coating formed on the substrate and made of a ceramic material, the refractory coating comprises at least two layers in a laminated structure each having fine cracks substantially extended in the direction of the thickness of each of the layers and filled with a refractory material in such a manner that the filled cracks in one layer are disconnected with the filled cracks in the adjacent layer.

A specific embodiment of the present invention is to provide a thermal land machine which comprises a heat resistant vessel for confining a hollow portion; a heat resistant composite structure disposed in the hollow portion and in contact with a hot gas flow of a temperature of higher than 1200° C.; and a passage for conducting the hot gas toward a part of the surface of the heat resistant composite structure, wherein the composite structure comprises a heat resistant substrate and a continuous refractory coating having a thickness of at least 100 $\mu$m on an average formed on the substrate and made of a ceramic material, the refractory coating has a thickness of at least 30 $\mu$m, and fine cracks the direction of which is substantially extended in the direction of the thickness of the coating, the cracks being filled with a refractory filling material in such a manner that permeation of the hot gas flow into the substrate is substantially prevented, wherein the fine cracks have been formed by heating the coating to a temperature higher than the temperature for forming the coating, prior to the filling.

Further, in the above thermal land machine, an intermediate bonding layer is preferably formed between the substrate and the refractory coating so as to increase the bonding strength of the coating to the substrate, the thickness of the intermediate layer being at least 30 $\mu$m.

Another specific embodiment of the present invention is to provide a thermal land machine which comprises a heat resistant hollow member for confining a chamber; a heat resistant composite structure disposed in the chamber and in contact with a hot flowing gas of a temperature higher than 1700° C.; and means for introducing the hot gas flow toward a part of the surface of the heat resistant composite structure, wherein the composite structure comprises a heat resistant substrate and a continuous refractory coating formed on the substrate and made of a ceramic material, the refractory coating has a thickness of 50 to 1000 $\mu$m and comprises at least two layers in a laminated structure each having a thickness of at least 30 $\mu$m and fine cracks the direction of which is substantially extended in the direction of the thickness of each of the layers, the cracks being filled with a refractory filling material in such a manner that permeation of the hot gas flow into the substrate is substantially prevented.

Further, the present invention is to provide a method of producing the heat resistant composite structure, which comprises forming a coating on a refractory substrate; subjecting the composite structure to a heat treatment at a temperature substantially higher than the operating temperature of the thermal land machine for a time sufficient to cause fine cracks when the composite structure is cooled to a substantially lower temperature than that of the heat treatment; and filling the resulting cracks with a refractory material in such a manner that permeation of the hot gas into the substrate is substantially prevented.

Still further, the present invention is to provide a method of producing the heat resistant composite structure, which comprises forming a first coating on a refractory substrate; subjecting the composite structure to a heat treatment at a temperature substantially higher than the operating temperature of the thermal land machine for a time sufficient to cause fine cracks when the composite structure is cooled to a substantially lower temperature than that of the heat treatment; filling the resulting cracks with a refractory material; forming a second coating on the first coating; subjecting the coatings and the substrate to a heat treatment at a temperature substantially higher than the operating temperature for a time sufficient to cause fine cracks in the second coating when the composite structure is cooled to a temperature substantially lower than that of the heat treatment; and filling the cracks with a refractory material in such a manner that the filled cracks in the first layer are disconnected with the filled cracks in the second layer in the direction of the thickness of the coating;

A preferable embodiment of the present invention is to provide a method of producing the heat resistant composite structure for use in the thermal land machine which comprises:

(1) forming a refractory ceramic coating by spray coating on a refractory substrate to form a composite refractory structure;

(2) subjecting the composite refractory structure to a heat treatment at a temperature substantially higher than the operating temperature of the thermal land machine for a time sufficient to cause fine cracks in the coating when the composite structure is cooled to a substantially lower temperature than that of the heat treatment;

(3) filling the resulting cracks with a refractory filling material in such a manner that permeation of the hot gas into the substrate is substantially prevented; and (4) repeating the steps (1) to (3) to form a desired coating on the substrate.

BRIEF DESCRIPTION OF THE DRAWINGS

FIG.2 is a perspective view of the movable blade 2 of FIG.1 to which the present invention is applied, FIG.3 is a perspective view showing a structure of the stationary blade 14 of FIG.1 to which the present invention is applied.

FIG.4a~FIG.4g are model cross sectional diagrams of members having covering layers according to the present invention, FIG.4h is a model diagram of a filling state of an environmental isolation material in cracks of a covering layer according to the present invention, FIG.5 is a schematic diagram of a high temperature corrosion simulating test equipment for gas turbine parts, FIG.6 is a cross sectional view of a combustor provided with a covering 7 layer of the present invention, FIG.7 is a schematic diagram of a high temperature oxidation test equipment.

DETAILED EXPLANATION OF THE INVENTION

Figure 1:
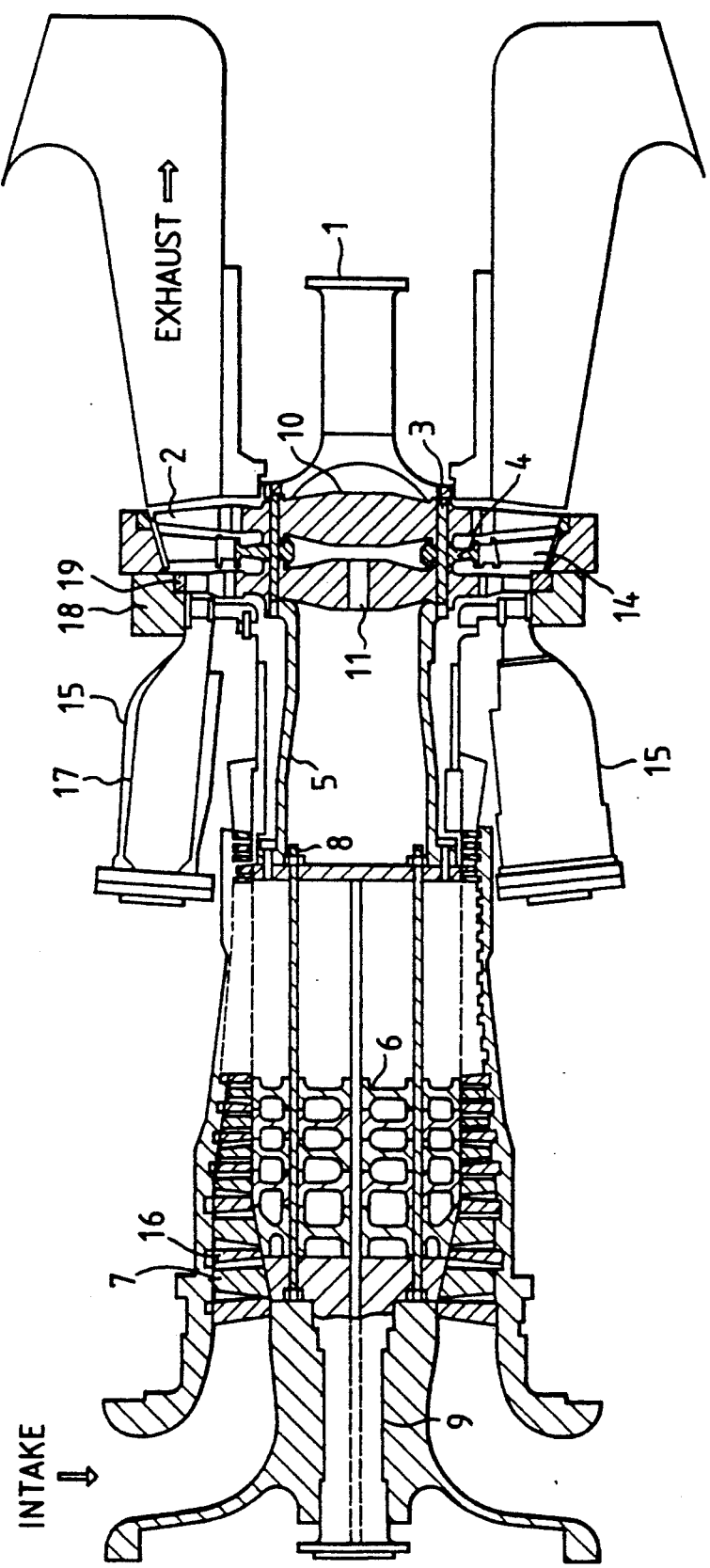
FIG.1 is a partial cross sectional view showing a gas turbine structure to which the present invention is applied.

The important points of the present invention is, 1) a method of forming cracks which relax a thermal stress, 2) filling of an isolating material from an environment into the cracks. The present inventors discovered that system structured of the covering layers are important for controlling the shape of cracks, and formed covering layers having variety of crack shapes as shown in FIG.4a~FIG.4g.

In FIG.4a, linear cracks along a cross section of the covering layer are formed and are discontinued in the covering layer. The cracks of these shapes are inherent to a covering layer having a columnar system and caused along boundaries between the columnar grains. Since damages in the covering layer due to thermal stress are induced along weak portions in the covering layer, the cracks are mostly induced along boundaries between columnar grains. Accordingly, the covering layer according to the present invention as shown in FIG.4a is obtained by laminating the covering layer in two layers, in that, at first the damaging i.e. crack formation 103 is carried out on a first layer 101 by a thermal stress, thereafter disposing a second layer 101 is disposed thereon and cracks are formed thereon in the same manner. Such cracks can be formed even if the covering layer is further multi-layered. The formation of the covering layer composed of the columnar system is enabled mostly by raising the temperature of the base member 102 during the formation of the covering layer. Further, a reduction of the covering layer formation speed is also effective. One method of damaging the covering layer, in other words, crack formation by thermal stress is to utilize a thermal stress during cooling after the covering layer formation when the temperature of the base member is high during the covering layer formation, and another method is to cause the damage with thermal stress by performing reheating treatment after the covering layer formation, in this instance the heating treatment is preferably carried out at a temperature equal to or more than the operating temperature of the heat resistant member including the covering layer.

Further, when the above cracks are observed from above the covering layer surface, their configuration is a turtle back shape and a size of one crack and a width forming the crack are important. As a result of study by the present inventors, a correlation was observed between the crack size and the channel width of the crack, and the larger the crack size is, the broader the channel width of the crack becomes. The channel width of the crack is important in view of the filling an isolating material therein for preventing an environmental material from osmosing, the filling of a microscopic channel below 0.5 μm with a isolating material was difficult even through methods such as CVI.

Further, for a channel of more than 50 μm, a sufficient filling of an isolating material therein was difficult even if repeating a sol-gel method for several tens of times. On the other hand, the channel width size of the crack controls a durability of the covering layer when a thermal load is repeated. In particular, when the channel width of the crack is large, and when a sufficient isolating material is not filled in the channel tip portion of the crack, such becomes a stress concentration portion and serves as a starting point of a new damage in the covering layer. Accordingly, in the present invention it is preferable to control the channel width of crack in a range of 0.5∼50 μm in particular in a range of 1∼30 μm. A control of the crack size in such range is enabled by controlling such as the thickness and the system of the covering layer. The channel width of the crack becomes large in dependence upon the thickness of the covering layer and the size of one columnar grain in the columnar system. Accordingly, when the operating temperature of the heat resistant material is high, such measures are to be taken as to reduce the thickness of respective covering layers and laminate thereof in multi-layers and to reduce the size of the columnar system. As the method of reducing the size of the columnar system, a method of decreasing the base member temperature during the formation of the covering layer and a method of increasing a formation speed of the covering layer are enumerated.

Further, with regard to the method of filling an environmental isolation material in the cracks, a CVD and a sol-gel method are effective, the treatment using these methods is carried out after formation of a first layer, then a second layer is formed thereon, thereafter again the cracks in the second layer are filled. In the covering layer of the present invention thus formed, since the cracks are discontinuous, an osmosis of the environmental material through the cracks is hardly induced, so that the thermal stress relaxation action by the cracks is sufficiently effected. Still further, since the isolation material is filled in the cracks so as to prevent an environmental material from osmosing, their durability is further enhanced.

FIG.4b is a schematic diagram of the system structure in the covering layer 101 wherein grains are laminated in layer. The covering layer having such system is likely to be obtained when such is formed by flame spray coating. In the covering layer having such system the cracks 103 having a complex configuration as shown in FIG.4b are caused by thermal stress. The reason of which is that the covering layer is in a layer shaped system and the cracks can not be linear because of the system into a cross sectional direction but is caused to be generated along laminated layer defective portion of flat grains.

With regard to the cracks having such shape, the environmental material hardly penetrates through the cracks. In addition, by filling an isolation material in the cracks, the above effect is further enhanced. Further, the cracks can be formed by heat treatment after forming the covering layer. The size of the channel width of the crack increases in dependence upon a heat treatment temperature and a thickness of the covering layer. Accordingly, the channel width of the cracks is formed in a range of 0.5∼50 μm by controlling the temperature and the thickness and an isolation material can be filled in the cracks.

FIG.4c shows a schematic cross sectional view in which a covering layer 101' having a system composed of columns and a covering layer 101 having a system composed of grains are combined, FIG.4d shows a schematic cross sectional view in which covering layers having systems 101 and 101' composed of grains of different grain size. When the temperature of the base member during the formation of the covering layer is high and the formation speed thereof is slow, the system of the covering layer is rendered into a columnar system, however when the temperature of the base member during the formation thereof is low, by employing the covering layers as shown in FIG.3∼FIG.6 growth and transfer of the cracks during the use of the member are prevented. Moreover, for further enhancing the above effect, it is advantageous to use another material constituting the covering layer in addition to the system modification in the covering layer. In such case physical properties of the material such as thermal expansion and Young's modulous, and the strength thereof differ, their effect is remarkable. Further, the structure shown in FIG.4g is also advantageous in which a covering layer composed of a different system or a covering layer composed of a different material is provided in a middle portion.

Further, in FIG.4a∼FIG.4g the bottom of the covering layer may be an intermediate layer such as a base member and a metal material.

FIG.4h is a schematic cross sectional view of the covering layer according to the present invention which shows a filled state of the isolation material in the cracks for preventing an environmental material from osmosing. The causes of the environmental material osmosis are such as oxidation, corrosion and plasma gas. Accordingly, from an ideal point of view, it is preferable that the inside of the cracks are filled up completely. However from an industrial point of view such is not necessarily practicable. When a formation speed of the covering layer is high, a grain shaped system is generated therein wherein the cracks therein are not necessarily linear in comparison with the crack configuration in the covering layer having a columnar system. This is because passages through which cracks easily develop are not definite as those in the columnar system.

However such is not so complex a configuration as that in the laminated system of FIG.4b. Accordingly, when the covering layers with different systems as shown in FIG.4c and FIG.4d are formed, the crack configuration in the covering layers is rendered complex as a whole, and osmosis of environmental materials hardly occurs. FIG.4e and FIG.4f show schematic cross sectional views of combination with a covering layer having a system of laminated structure, wherein the crack configuration in the covering layer as a whole is rendered further complex and the osmosis of environmental materials hardly occurs. When the covering layers having such different systems are combined, since the crack configurations in the respective covering layers are different, the following advantages are obtained by combining a variety of cracks.

When a temperature ingredient is produced in a member provided with a covering layer (in that the surface of the covering layer is heated and the base member side is cooled), the surface temperature of the covering layer rises and the thermal stress is also increased. In such a condition, the osmosis of environmental materials can be prevented by any of the filled conditions shown in FIG.4h.

DETAIL EXPLANATIONS OF THE EMBODIMENTS

Embodiment 1

A Ni base alloy (Rene'80) was used as a base member, an alloy layer composed of Co-20Cr-12Al-0.5Y was provided on the surface, and a covering layer composed of $ZrO_2$-8%$Y_2O_3$ was further provided on the surface. The thickness of the alloy layer was 100 μm, and that of the covering layer was 400 μm. The alloy layer was formed through an electron beam evaporation method under a condition of 15kw output, $10^{-5}$ Torr of vacuum and 500° C. of the base member temperature. Thereafter, the covering layer was formed by using $ZrO_2$-8%$Y_2O_3$ as the evaporation source under a condition of 10 kw of electron beam acceleration voltage, 1500 mA of beam current, $10^{-4}$ Torr of vacuum, and 600° C. of the base member temperature.

The formation speed of the covering layer of $ZrO_2$-8%$Y_2O_3$ was 20 μm/h. After forming the covering layer of about 200 μm under the above condition, the layer was heat-treated under the vacuum of $10^{-5}$ Torr at 1200° C. for 1 hour. As the result, turtle back shaped cracks were produced over the whole surface of the covering layer of $ZrO_2$-8%$Y_2O_3$, the size of one crack was 2~4 mm long and the channel width of the crack was 5~10 μm. Next the cracks were filled with $ZrO_2$ by using a sol-gel method, which includes a cyclic repetition of vacuum impregnation and burning, and the burning temperature was 700° C. and the cycle was repeated 5 times. Thereafter, a layer of $ZrO_2$-8%$Y_2O_3$ was again formed on the surface to a thickness of about 200 μm by an electron beam evaporation. The condition thereof was the same as the forming condition of the above first layer of $ZrO_2$-8%$Y_2O_3$. After this the crack formation and filling of the isolation material was carried out with the heat treatment and the sol-gel method in the same manner as in the first layer formation.

The covering layer of the present invention thus produced was the same as shown in FIG.4a, wherein a columnar system of $ZrO_2$-8%$Y_2O_3$ was formed, cracks was formed in respective covering layers of the first and second layers and the inside of the cracks was mostly filled with $ZrO_2$. Further, cracks generated respectively on the first and second layers at different positions and no cracks were observed which penetrated through the both layers. By using test pieces including the covering layer of $ZrO_2$ series thus produced a durability test was performed with an evaluation method shown in FIG.5. The evaluation method employed a plasma arc of 50 kw as a heating source and added an aqueous solution of $NaCl$-$Na_2SO_4$ into the plasma arc through a nozzle. The base member side of the test piece was water-cooled and the heat flux within the test piece was kept at $1\times10^6$ kcal/h.m². In this instance, the temperature of plasma which is the combustion medium was about 1500° C. at the surface of the test piece.

The surface temperature of the covering layer of $ZrO_2$ series was 1200° C. and there appeared the temperature difference of about 400° C. in the covering layer of 400 μm thick. Under these conditions the plasma arc was switched on-off to repeat heating and cooling. This evaluation condition simulated a gas turbine member which was exposed to a high temperature corrosive environment. The thermal conditions such as the heat flux are substantially the same with an actual machine. Further, as comparison members, the following test pieces were used, a test piece (test piece No.101) prepared by an electron beam evaporation method as disclosed in U.S. Pat. No. 4,095,003, a test piece (test piece No.102) prepared according to the above production method except for the environmental material osmosis prevention treatment with the sol-gel method, and further a test piece (test piece No.103) prepared according to the above production method wherein after formation of the covering layer of $ZrO_2$-8%$Y_2O_3$ and of 400 μm thick, a heat treatment was carried out.

Further, a test piece (test piece No.104) prepared according to the above production method in which after formation of the covering layer of $ZrO_2$-8%$Y_2O_3$ and of 400 μm thick a treatment with the sol-gel method was performed, and a test piece (test piece No.105) prepared in the same manner in which after formation of the covering layer of $ZrO_2$-8%$Y_2O_3$ and of 200 μm thick, a treatment with the sol-gel method was performed, and further the covering layer of 200 μm thick was formed and thereafter a treatment with the sol-gel method was performed, were also used as comparison members.

Before the test no cracks were observed in the covering layers of $ZrO_2$-8%$Y_2O_3$ of the test piece Nos.101, and 105. Table 1 shows a test result wherein heating and cooling were repeated 300 times. On a test piece (test piece No.10) provided with the covering layer according to the present invention no damages were observed, however on the other test pieces damages were produced in the repetition of 50~100 times. The result of observation on the damaged portions revealed that with regard to the test piece Nos.101, 104, and 105 cracks were produced in the covering layer of $ZrO_2$-8%$Y_2O_3$ and the cracks reached to the alloy layer. Further, the corrosion of the alloy layer proceeded at these portions. The damages of the covering layer was induced by a reduced adhesion with the covering layer of $ZrO_2$-8%$Y_2O_3$ due to the corrosion of the alloy layer.

Further on the test piece Nos.102, and 103 mostly the same damage states were observed.

Embodiment 2

By using a Cu base member a covering layer of the present invention was formed by using the same materials and method in Embodiment 1. Further in this instance, the thickness of the alloy layer was 50 μm, and the thickness of the covering layer of $ZrO_2$-8%$Y_2O_3$ was 50 μm. Further, the thickness of the first layer and the second layer in the covering layer of $ZrO_2$-8%$Y_2O_3$ were respectively 25 μm. Still further, the heat treatment temperature in the present embodiment was 900° C. and the sol-gel method treatment was respectively applied on the first layer and the second layer in the same manner as in Embodiment 1. A durability evaluation was carried out on the covering layer by using the evaluation device shown in FIG.5 in the same manner as in Embodiment 1. In the drawing, on a test piece (one in which the above coating was applied on the Cu base member) 22 plasma 21 was irradiated through a plasma generation gun 20, further water was supplied to the back face of the test piece 22 with a cooling nozzle through a cooling water supply line 25. Further, salt water was supplied into the plasma through a salt water spray nozzle 26 from a salt water supply line 27. Still further, the output of plasma arc was 80 kW, the thermal flux $7\times10^6$ kcal/h.m², the surface temperature of the covering layer of $ZrO_2$-$8\%Y_2O_3$ 900° C. and the temperature difference in the covering layer of 50 μm thick 150° C. As the result of the same test as Embodiment 1, no damage were observed on the covering layer of the present invention after subjecting thereof to the repetition cycles of 300 times.

Embodiment 3

A covering layer of the present invention was prepared with a plasma flame spray method by using the same material as in Embodiment 1. The alloy layer forming condition was such that the plasma output was 40 kW, and with Ar-$H_2$ plasma a flame spray was carried out under Ar atmosphere of 50 Torr. The temperature of the base member was 600° C. Thereafter powder of $ZrO_2$-$8\%Y_2O_3$ was flame-sprayed with Ar-$H_2$ plasma at the plasma output of 55 kW. The temperature of the base member at the moment of the flame spray was 170° C. After this, the heat treatment was carried out in the same manner as in Embodiment 1, and further the sol-gel method treatment was applied.

Further, in the present embodiment too, the following test pieces were prepared, a test piece (test piece No.201) which was produced only by applying the heat treatment, a test piece (test piece No.202) which was produced by applying neither the heat treatment nor the sol-gel method treatment, and a test piece (test piece No.207) which was produced only by applying the sol-gel method treatment, a durability test was carried out under the same condition as in Embodiment 1. Further the result of observation on the cross section of the test pieces according to the present invention before test was the same as in FIG.4b, in that cracks of complex configuration were formed the size and channel width of which was 2~4 mm long and 3-10 μm wide respectively and the cracks were mostly filled with $ZrO_2$. As the result of the surface observation, the cracks were formed in turtle back shape. The result of the durability test was as shown in Table 1 in that the test piece (test piece No.20) provided with the covering layer of the present invention was sound however the test piece Nos.201 and 202 were damaged in the repetition cycles of 70~90 times. Further, the observation result on the damaged portion was the same as in Embodiment 1.

TABLE 1

| Test piece No. | Test result |
| --- | --- |
| 10 | No damage at 300 times |
| 101 | Damaged at 49 times |
| 102 | Damaged at 52 times |
| 103 | Damaged at 98 times |
| 104 | Damaged at 60 times |
| 105 | Damaged at 57 times |
| 20 | No damage at 300 times |
| 201 | Damaged at 70 times |
| 202 | Damaged at 92 times |
| 203 | Damaged at 70 times |

Embodiment 4

An example of land machines to which the present invention is applied is a gas turbine as shown in FIG.1. FIG.1 is an illustration of an embodiment to which the present invention is applied. FIG.1 shows a gas turbine which employs the heat resistant composite structure of the present invention. In this embodiment, two stages of turbine disc 10 are provided, and the turbine disc 10 on the upstream side of the gas flow has a central hole 11. All the turbine discs in this embodiment were made of a heat resistant steel. Moreover, in this embodiment, the heat resistant steel was used for a compressor disc 6 at the final stage on the downstream side of the gas flow, a distance piece 5, a turbine spacer 4, a turbine stacking bolts 3 and a compressor stacking bolts 8. Heat resistant alloys were used for other parts, i.e., a turbine blades 2, a turbine nozzle 14, a liners 17 of a combustors 15, a compressor blades 7, a compressor nozzle 16, a diaphragm 18 and a shroud 19. In particular, the turbine nozzle 14 and the turbine blades 2 were made of casting. The compressor in this embodiment has seventeen stages of compressor discs. A turbine stub shaft 1 and a compressor stub shaft 9 in this embodiment were also constructed in a conventional manner.

FIG.3 shows a stationary gas turbine blade of a Co based superalloy provided with the covering layer of Embodiment 3 according to the present invention. In FIG.3 a covering layer 113 of the present invention was provided on a blade face 110 and gas pass portions 111 and 112. As a result of combustion test at a combustion gas temperature of about 1200° C. for 300 hours simulating an actual turbine carried out by using this gas turbine stationary blade, no damage on the covering layer was observed.

Embodiment 5

FIG.2 shows a movable gas turbine blade of a Ni based superalloy provided with the covering layer of Embodiment 1 according to the present invention. A covering layer 113 of the present invention was provided on the front edge portion of the blade as shown by hatching in FIG.2. As a result of combustion test at a combustion gas temperature of about 1200° C. for 300 hours simulating an actual turbine carried out by using this gas turbine movable blade, no damage on the covering layer was observed.

Embodiment 6

FIG.6 shows a cross-sectional view of a water cooling or liquid hydrogen cooling type combustor. A base member 114 of Cu has a bonded structure with a solder material 115, and the covering layer was provided on the side of the combustion chamber. A simulated combustor provided with the covering layer of Embodiment 2 according to the present invention was prepared and a test was carried out at 1400° C. by using a combustion gas. In the test cooling water was flowed in the gap 116 in FIG.6. As a result of the test for 300 hours, no damage was observed on the covering layer of the present invention. The thermal flux of such water cooling type combustor was $7 \times 10^{-6}$ kcal/h.m² during the combustion test, a heat isolation effect with the ceramic covering layer of 50 μm thick was 70° according to calculation.

Embodiment 7

A graphite complex material (C/C material) composed of a graphite fiber and a graphite matrix was used as a base member, and a SiC covering layer was formed thereon with a CVD method. As a source of the CVD, $SiCl_4$ was used, and the SiC covering layer was formed at a treating temperature in a range of 1,200°~1,600° C. The covering layer formation speed was carried out in a range of 20~80 μm/h by controlling the treatment temperature and the $SiCl_2$ gas. Table 2 shows an observation result on cross sectional systems of the SiC covering layers formed under a variety of conditions. As will be apparent from Table 2, the system of the covering layer was controllable by changing the CVD condition. Further, since the thermal expansion coefficient between the C/C material and the SiC, cracks were generated in the covering layer after the film formation of SiC.

TABLE 2

| Sample No. | Temperature °C. | Speed μ/h | System of SiC covering layer |
|---|---|---|---|
| A | 1600 | 80 | Columnar, size of columnar system 15~25 μm |
| B | 1600 | 40 | Columnar, size of columnar system 10~20 μm |
| C | 1500 | 60 | Columnar, size of columnar system 10~20 μm |
| D | 1500 | 30 | Columnar, size of columnar system 5~10 μm |
| E | 1400 | 20 | Columnar, size of grain system 10~25 μm |
| F | 1400 | 10 | Columnar, size of grain system 10~15 μm |
| G | 1300 | 40 | Columnar, size of grain system 10~20 μm |
| H | 1300 | 20 | Columnar, size of grain system ~5 μm |

In the present Embodiment, test pieces were prepared by changing combinations of CVD conditions of a first layer and a second layer as show in Table 3. The heating treatment in Table 3 was at 1,600° C. for 1 hour under $10^{-5}$ Torr vacuum.

TABLE 3

| Test piece No. | First layer CVD No. | First layer heat treatment | First layer sol-gel | Second layer CVD No. | Second layer heat treatment | Second layer sol-gel |
|---|---|---|---|---|---|---|
| S-101 | A | Yes | Yes | — | — | — |
| S-102 | C | Yes | Yes | — | — | — |
| S-103 | G | Yes | Yes | — | — | — |
| S-104 | E | Yes | Yes | — | — | — |
| S-105 | G | Yes | Yes | B | Yes | Yes |
| S-106 | H | Yes | Yes | E | Yes | Yes |
| S-107 | F | Yes | Yes | A | Yes | Yes |
| S-108 | D | Yes | Yes | B | Yes | Yes |
| S-109 | B | No | No | — | — | — |
| S-110 | G | No | No | — | — | — |
| S-111 | B | No | Yes | — | — | — |
| S-112 | G | Yes | No | — | — | — |
| S-113 | G | No | Yes | B | No | Yes |
| S-114 | G | Yes | No | B | Yes | No |
| S-115 | G | No | No | B | No | No |

After the first layer of SiC was formed, SiO₂ was filled in the cracks by using a sol-gel method, which included about five time repetitions of a vacuum impregration which was repeated five times treatment process of tetraethyl orthosiliate and a thermal resolution process at 300° C. thereafter. The second layer of SiC was formed after that and SiO₂ was further filled in the cracks of the second layer in the SiC covering layer with the above sol-gel method. A part of the prepared test pieces were provided with the covering layer having only the first layer. The result of the cross sectional system observation of the test pieces showed that S-108 of the covering layer according to the present invention has the same schematic cross sectional view as that in FIG.4a, the first layer and the second layer were constituted by the columnar system, cracks having a channel width of 5~10 μm were formed on the covering layer, and SiO₂ was filled in the cracks.

S-105 and S-107 had the same systems as that in FIG.4c, S-106 had the same system as that in FIG.4d, in the respective covering layer in the first layer and the second layer cracks having the channel width of 5~10 μm were formed, and inside thereof SiO₂ was filled. Further, the test pieces S-109~S-115 were ones for comparison. Further, in the present Embodiment the thickness of the first layer was selected to be 75 μm, and the thickness of the second layer was selected to be 75 μm.

Figure 8:
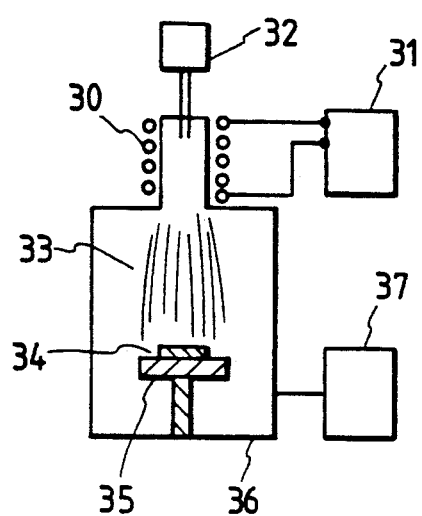
FIG.8 is a schematic diagram of a durability test equipment in a high temperature plasma.
Figure 9:
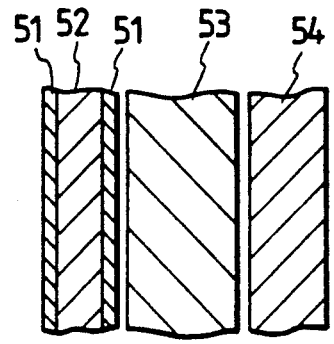
FIG.9, FIG.10a and FIG.10b are cross sectional views of environmental isolation members using a metal material or a ceramic material as their main body.

A durability test of the test pieces having such covering layers was carried out by using an oxidation test equipment shown in FIG.7 and a plasma oxidation test equipment shown in FIG.8. The equipment shown in FIG.7 is substantially the same as that in FIG.5, except that in place of providing a cooling system the test piece temperature was measured with a thermocouple 28. In FIG.8, a test piece was rested on a holding jig 35 and charged in a chamber 36 having an exhaust system. A gas supplied from a gas supply system 32 was converted into a plasma 33 through a high frequency generating coil 30 energized by a high frequency power source 31 and irradiated upon a test piece. The oxidation test was carried out by heating a test piece in atmosphere by using a plasma arc of 50 kW as shown in FIG.7 and heating and cooling of the test pieces were repeated by switching the plasma arc into on/off. The temperature of the plasma was about 1700° C. at the surface of the test piece. In this instance, the test piece was heated at 1,600° C. for 3 minutes and thereafter air cooled to a room temperature. The cooling time was about 20 minutes. In the present Embodiment, heating and cooling was repeated 100 times. The result thereof is shown in Table 4. The evaluation was performed on a weight reduction in comparison with that before the test. In cases of the covering layers S-101~S-108 according to the present invention, the weight reductions were below 0.2%. Further, in cross section observation result after the test both the covering layer and the base member were sound.

On the other hand, the weight change rate of the comparison materials S-109~S-115 was large, and as a result of the cross section observation, an oxidation consumption of the base member advanced at the crack tip portions of the covering layer. In particular, new cracks were produced after the test in the test pieces S-111 and S-113 due to the thermal load during the test and damages advance at those portions.

Further, when no sol-gel treatment was performed, the degree of the damage was large. In the plasma oxidation test oxygen gas plasma was generated with a high frequency power of 100 kW as shown in FIG.8, and the test pieces were disposed therein for evaluation. The temperature of the plasma was about 2000° C. at the surface of the test piece. The test pieces were heated at 1,700° C. for about 20 minutes. The evaluation was performed on the weight reduction amount in comparison with that before the test. The weigh reduction amounts of the test pieces S-101~S-108 to which the covering layers of the present invention were provided were below 1%. Further, the weight reduction amount of the comparison material S-109~S-115 was more than 10%, and in some extreme cases, since the wear of the test pieces was severe the weight evaluation was difficult.

As explained above, the C/C material provided with the covering layer of the present invention is excellent in its high temperature durability.

TABLE 4

| Test piece No. | Weight reduction rate (%) | |
| --- | --- | --- |
| | Repeated oxidation test | Plasma oxidation test |
| S-101 | 0.1 | 0.7 |
| S-102 | 0.1 | 0.5 |
| S-103 | 0.2 | 0.8 |
| S-104 | 0.1 | 0.8 |
| S-105 | 0.2 | 0.9 |
| S-106 | 0.1 | 0.6 |
| S-107 | 0.1 | 0.5 |
| S-108 | 0.1 | 0.4 |
| S-109 | 12.0 | Hard to evaluate because of severe damage |
| S-110 | 10.5 | Hard to evaluate because of severe damage |
| S-111 | 8.5 | 25 |
| S-112 | 13.0 | Hard to evaluate because of severe damage |
| S-113 | 6.4 | 18 |
| S-114 | 10.5 | Hard to evaluate because of severe damage |
| S-115 | 9.6 | Hard to evaluate because of severe damage |

Embodiment 8

Figure 15:
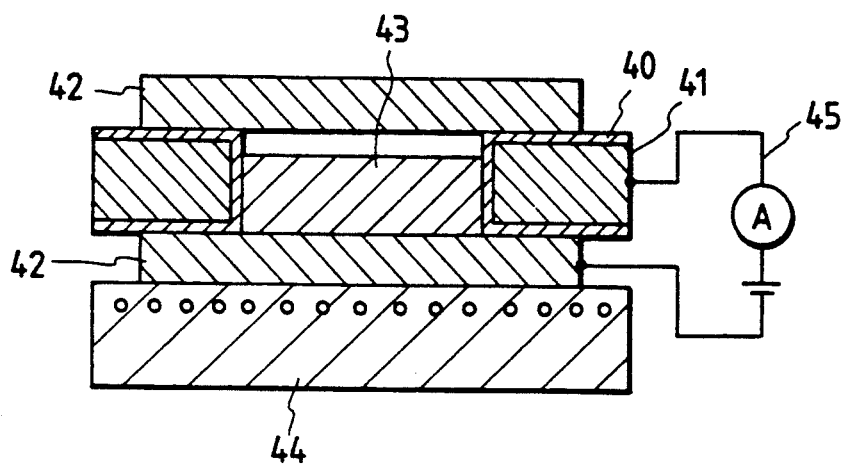
FIG.15 shows a cross sectional view of a durability test equipment in a molten salt.

A heat resistant member having a constitution as shown in FIG.15 was formed by an oxidation resistant and heat resistant carbon member provided with the oxidation resistant covering layer made of the coated film of the two layers according to Embodiment 7. Namely, the thickness of an oxidation resistant and heat resistant carbon member of a C/C composite plate 52 having an oxidation resistant covering layer 51 on both front and back faces was selected to be 5 mm, on this oxidation resistant and heat resistant carbon member, a porous heat insulation material 53 of alumina system having a thickness of 10 mm and a Ni based heat resistant alloy plate 54 having a thickness of 3 mm and constituting a main body were successively combined so as to contact each other to prepare a heat resistant member A. In such heat resistant member, the oxidation resistant and heat resistant carbon member faces the heating side.

For comparison, a prior art oxidation resistant and heat resistant carbon made of a single layered coating film and having a thickness of 5 mm formed in the same manner as explained in connection with Embodiment 7 was prepared, thereon the porous heat insulation material 53 of alumina system having a thickness of 10 mm and the Ni based heat resistant alloy plate 54 having a thickness of 3 mm were successively combined so as to contact each other to prepare a heat resistant member B.

A durability test of these heat resistant members was carried out by using the test equipment shown in FIG.7. This test equipment has been explained in connection with Embodiment 7, here the explanation thereof is omitted. In the durability test, at first the oxidation resistant and heat resistant carbon member side of the heat resistant member was heated by plasma jet, and the Ni based alloy side was cooled by using compressed air. The result of the measurement with a radiation thermometer at this instance indicated that the surface temperature of the oxidation resistant and heat resistant carbon member which was the heated side was 1,600° C. and the Ni based heat resistant alloy which was the cooled side was 700° C.

On the other hand, when the plasma jet was switched off and the cooling air was kept flowing, the surface temperature of the oxidation resistant and heat resistant carbon member was subjected to 350° C. for about 5 minutes. In such a temperature gradient environment, the evaluation test including heating and cooling like in Embodiment 7 was carried out. As the result, with regard to the heat resistant member A according to the present Embodiment, even repeating the heating and cooling cycles in 100 times the C/C composite material was sound and no temperature change in the Ni based heat resistant alloy was observed. Further, with regard to the oxidation resistant and heat resistant carbon member having the prior art covering layer, such was extremely damaged after repeating the heating and cooling cycles in 100 times, and when viewed from the heating side the heat isolation material of alumina system was exposed and a part of the surface was damaged. As the result, the heat isolation property of the heat isolation member was reduced and the temperature of the Ni based heat resistant alloy was raised to 900° C. during the heating cycle.

As explained above the heat resistant member A of the present Embodiment has an excellent durability and the temperature of the Ni base heat resistant alloy which is one of constituents of the heat resistant member A can be maintained low. The heat resistant member of such constitution is effective for a high temperature use member.

Figure 10A:
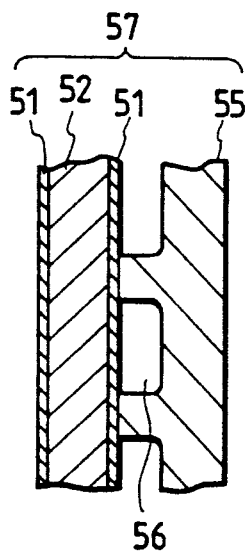
Figure 10B:
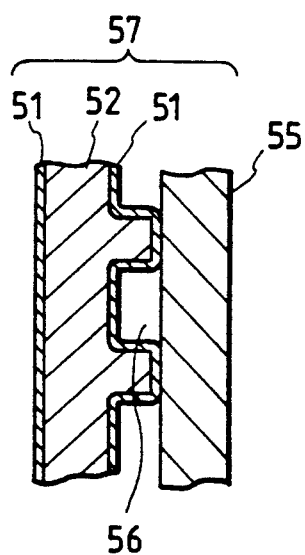

By using an oxidation resistant and heat resistant carbon member having a two layered oxidation resistant coating film of Embodiment 7, a heat resistant member having a constitution in which a gap for passing cooling medium was provided as shown in FIG.10a and FIG.10b was prepared In the heat resistant member shown in FIG.10a, an oxidation resistant and heat resistant carbon member 57 having a thickness of 5 mm and composed of a C/C composite 52 both faces of which are covered with oxidation resistant covering layers 51, and a structural member 55 are combined, and a gap 56 passing cooling medium is provided on the side of the structural member 55 of the Ni base heat resistant alloy at its facing portion. Further, in the heat resistant member shown in FIG.10b, a gap 56 for cooling medium is provided on the back face of a C/C composite 52, and on the front and back faces thereof two layered oxidation resistant coating films 51 of Embodiment 7 are covered, and an oxidation resistant and heat resistant carbon member 57 having a thickness of 5 mm excluding the gap length is joined at its back face with a structural member 55.

Since the above heat resistant member having the structure in which a gap is provided can flow coolant through the gap, when the oxidation resistant and heat resistant carbon member side is heated, a temperature reduction of the structural member is achieved by the heat insulation action of the oxidation resistant and heat resistant carbon member of a high temperature heat resistant material and by the cooling action of the coolant flowing through the gap.

Figure 11:
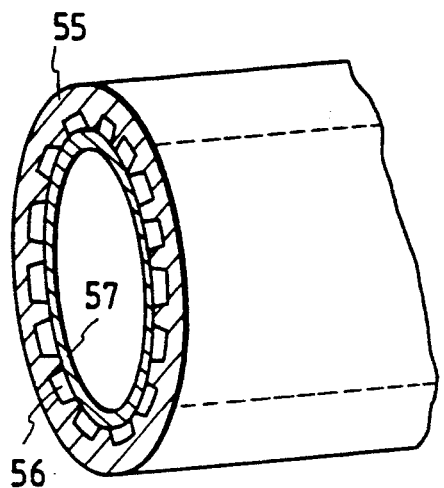
FIG.11 and FIG.12 are perspective views of gas turbine parts employing environmental isolation members according to the present invention.

FIG.11 shows a schematic cross sectional view of a part of a combustor which was constituted with the same heat resistant member as shown in FIG.10a. The part of the combustor is a cylindrical shape and the combustion is performed inside the cylinder. Therefore the inner face of the combustor part is exposed to a high temperature. Cooling of a prior art combustor part was carried out with compressed air for reducing the temperature of a constituent metal material. However, with this method the cooling medium is introduced into the combustion gas and causes temperature reduction of the combustion gas. In case of the combustor part having the structure according to the present Embodiment, the oxidation resistant and heat resistant carbon member 57 having an excellent strength at a high temperature and an excellent durability at a high temperature is used for the member which contacts to the combustion gas, therefore no film shaped cooling over the surface of the member which contacts the combustion gas is necessary. Further, the structural member is effectively cooled by flowing compressed air only through the gap between the oxidation resistant and heat resistant carbon member 56 and the structural member 55 of the Ni base heat resistant alloy and no mixing of the compressed air into the combustion gas is necessary.

Accordingly, in the combustor part of the present embodiment, the temperature reduction of the combustion gas is remarkably reduced in comparison with that using the combustor part of the conventional structure. Further, both a metal material and a ceramic material may be used for the structural member 55 of the combustor part according to the present embodiment. In particular, when the ceramic material is used, a thermal shock which is generated during ignition or extinction of the combustion gas is absorbed by the oxidation resistant and heat resistant carbon member 57, and a further advantage of preventing the ceramic member from damage is obtained.

Figure 12:
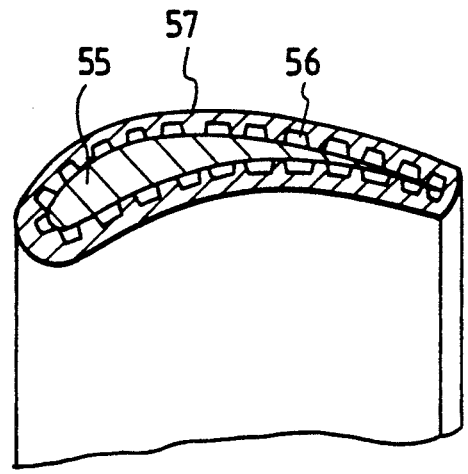

FIG.12 shows a schematic cross sectional view of a turbine blade constituted with the same heat resistant member as shown in FIG.10b. Since the turbine blade is exposed to a high temperature, the temperature of the outer surface of the blade increases. A prior art turbine blade is constituted by a metal material or a constitution in which a ceramic is coated over a metal material so that the cooling with compressed air is carried out for reducing the temperature of these constitution.

The cooling method includes such as one employing a structure in which the inside of the turbine blade is constructed in a hollow structure to cool the inside and thereafter the cooling air is discharged from the back edge side of the blade into the combustion gas and further one employing a structure in which small holes are provided on the turbine blade and compressed air is blown out from the small hole to form a film for cooling over the outer surface of the turbine blade exposed to the combustion gas. All of these methods necessite a great amount of compressed air so that a reduction of the turbine efficiency is induced.

Further, since the cooling medium is discharged into the combustion gas so that a reduction of combustion gas temperature is caused. In the turbine blade of the present embodiment, since the outer surface of the turbine blade exposed to combustion gas has a structure constructed by the oxidation resistant and heat resistant carbon member 57 excellent in strength at a high temperature and durability at a high temperature, no film formation for cooling over the surface of the member contacting the combustion gas is necessary.

Because of the heat isolation action of the oxidation resistant and heat resistant carbon member 57, even a small amount of cooling air passing through the gap 56 between the oxidation resistant and heat resistant carbon member 57 and the structural member 55 of the Ni base heat resistant alloy meets the requirement. Accordingly, since with the turbine blade of the present embodiment in comparison with the turbine blade having a conventional structure the reduction of the combustion gas temperature is small and as well amount of the cooling air can be limited so that a reduction of the turbine efficiency is restricted. Both a metal material and a ceramic material may be used for the structural member of the turbine blade according to the present invention. In particular, when the ceramic material is used, a thermal shock caused during ignition or extinction of the combustion gas is absorbed by the oxidation resistant and heat resistant carbon member and a further advantage of preventing the ceramic member from damaging is obtained.

Embodiment 9

The same C/C material as in Embodiment 7 was used for a base member, on the surface of which a SiC covering layer having a thickness of about 50 $\mu$m was formed with a CVD method under the CVD conditions B, and G in Table 2. Thereafter the layer was heat treated at a temperature of 1,600° C. in a vacuum of $10^{-5}$ Torr for 1 hour. Further the sol-gel method treatment was performed in the same manner as in Embodiment 7. In the present Embodiment after thus forming a first layer, as a second layer, a covering layer of $ZrO_2$-8%$Y_2O_3$ having a thickness of about 50 $\mu$m was provided by using the same plasma flame spray method as in Embodiment 3. Thereafter, the above heat treatment was carried out, and further the cracks were filled with $ZrO_3$ through the same sol-gel method treatment as in Embodiment 1. The thus prepared covering layer of the present invention had the same cross section system as in FIG.4e and FIG.4f, and as the result of the oxidation test and the plasma oxidation test, substantially the same durability as that of the covering layer of the Embodiment according to the present invention was obtained.

Embodiment 10

The same C/C material in Embodiment 7 was used for a base member, on the surface of which $Y_2O_3$ covering layer was formed with a plasma flame spray method. In this method like Embodiment 3 powder of $Y_2O_3$ was flame-sprayed on the C/C material to form the covering layer having a thickness of about 100 $\mu$m. Thereafter, the covering layer was heat treated at a temperature of 1,200° C. in a vacuum of $10^{-5}$ Torr for 1 hour, and further the cracks in the covering layer caused by the heat treatment were filled with $Y_2O_3$ through the sol-gel method.

The thus formed covering layer of the present invention has mostly the same system as that of FIG.4b, and cracks having a channel width of 5~20 $\mu$m was formed in the covering layer. By using a test piece provided with this covering layer the same evaluation test was performed as in Embodiment 7. Further, heating temperature of the test pieces in every test was 1,100° C. As the result, the weight reduction amount in comparison with that before the test in every test was below 1%, and substantially the same durability as in Embodiment 7 was obtained.

Embodiment 11

The same C/C material in Embodiment 7 was used for a base member, on the surface of which a SiC covering layer having a thickness of about 30 $\mu$m was formed with the CVD method under the CVD condition B in Table 2. On the surface of the SiC covering layer turtle back shaped cracks were formed due to a difference of thermal expansion with the base member and the channel width of the cracks was 5~10 $\mu$m.

Figure 13:
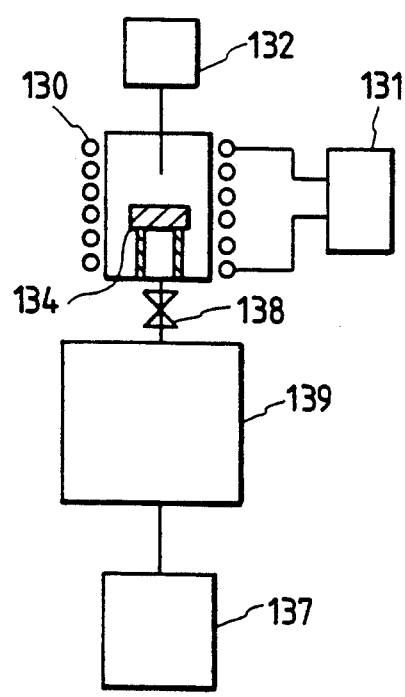
FIG.13 is a schematic diagram of a CVI equipment.

Next, SiC was formed in the above cracks with the CVI equipment as shown in FIG.13. In the drawing, a substrate 134 was disposed in a treatment chamber provided with a high frequency generating coil 130 connected to a high frequency power source 131. Gas was supplied from a CVD gas supply line and a SiC covering layer was formed on the base member heated by the high frequency generating coil. The pressure of a pressure regulating chamber 139 is regulated through a valve 138 and that of the treatment chamber through an exhaust line 137. The CVI was carried out under the following condition in that, the temperature of the base member 134 was at 1,400° C., and the pressure in the treatment chamber was regulated between 760 Torr and 20 Torr in 1~3 second interval. As the result, after about 1 hour treatment the above cracks were substantially filled with SiC.

After this, on the surface a TiN layer was formed with a CVD method. By using $TiCl_4$ and $N_2$ as CVD gas and under a forming condition of a base member temperature at 1,100° and treatment for about 2 hours a TiN covering layer having a thickness of about 30 μm was formed. Thereafter the covering layer was heat treated at a temperature of 1,600° C. in a vacuum of $10^{-5}$ Torr and for 1 hour and cracks having a channel width of 5-15 μm were formed in the TiN covering layer. Further, with the above CVI equipment, the crack filling treatment with SiC in the TiN covering layer was carried out. Thus, the obtained covering layer of the present invention had almost the same system as that in FIG.4a.

For evaluating the durability of the thus prepared covering layer of the present invention, a method was carried out in which $H_2$ plasma arc was formed by using the equipment shown in FIG.8, and the covering layer was heated therein. The heating temperature was 1,600° C. and a heating for 10 minutes and a cooling for 10 minutes were repeated in 20 times. Such a durability test in $H_2$ plasma simulates a heat resistant reactor wall material in a nuclear fusion reactor which is exposed to a high temperature $H_2$ plasma.

Further, in the present Embodiment, a few test pieces (T-102~T-104) of comparison materials as shown in Table 5 were also tested. Table 6 shows their results. The evaluation is performed on a weight reduction amount in comparison with that before the test.

TABLE 5

| Test piece No. | First layer Material, thickness μ | First layer Heat treatment | First layer Filling of cracks | Second layer Material, thickness μ | Second layer Heat Treatment | Second layer Filling of cracks |
|---|---|---|---|---|---|---|
| T-101 | Sic,30 | No | SiC | Tin,30 | Yes | SiC |
| T-102 | " | " | No | " | " | No |
| T-103 | " | " | SiC | — | — | — |

TABLE 6

| Test piece No. | Weight reduction rate (%) |
|---|---|
| T-101 | 0.05 |
| T-102 | 3.0 |
| T-103 | 1.8 |

With the covering layer (T-101) of the present invention substantially no weight change were observed, however with the comparison materials (T-102~T-104) a weight reduction of a few % was observed to have been caused. A result of cross section observation after the test, a part of the base member in the comparison materials was observed to have been damaged by a reaction with $H_2$ plasma.

Figure 14:
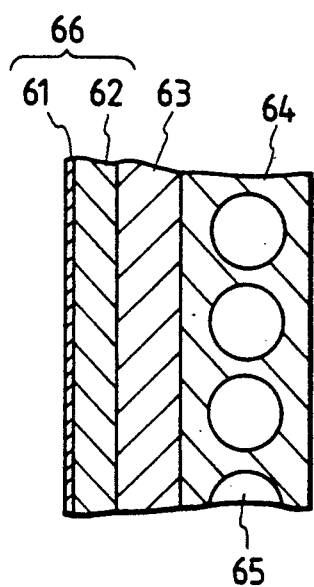
FIG.14 is a cross sectional view of a constitutional body in a plasma generation chamber for a nuclear fusion reactor using an environmental isolation member of the present invention.

On the other hand, the test piece provided with the covering layer of the present invention was sound and no damage thereof was observed. FIG.14 is a partial cross sectional view of the constitutional body in the plasma generating chamber for a nuclear fusion reactor using a C/C material 66 excellent in an environmental isolation characteristic in which a covering layer 61 of the above present invention is provided on one surface of the above C/C material having a thickness of 10 mm. The face provided with the C/C material 66 is to be exposed to a high temperature plasma. The C/C material has a structure to be connected to a structural member 64 of Cu constituting the main body of the plasma generation chamber through an intermediate structural body 63 formed of a composite material of Cu and C. The structural member 64 has a structure in which a gap passage 65 is provided for water cooling and the heat input from the high temperature plasma is cooled by the cooling water The constitutional body of the plasma generation chamber for a nuclear fusion reactor as shown in FIG.14 is in particular exposed to a hydrogen plasma under a high temperature condition, a reaction between the hydrogen plasma and the carbon constituting the C/C material is caused, and the C/C material wears extremely. By such wear of the C/C material, when the intermediate structural body or the main structural body is exposed, damage of these structural bodies further proceeds extremely due to their low melting points and their roles as structural bodies are lost. A model segment of the constitutional body in the plasma generation chamber for a nuclear fusion reactor as shown in FIG.14 was prepared, and by using the test equipment as shown in FIG.8, an evaluation test on durability in the hydrogen plasma was carried out. The surface temperature of the C/C material 66 was set at 1,400° C. and the temperature of the structural member 64 of Cu was at 350° C. As a result of 20 time repetitions between a heating time of 10 minutes and a cooling time of 10 minutes, no damage was observed on the C/C material 66 which was exposed to the hydrogen plasma and the constitutional body of the plasma generation chamber for a nuclear fusion reactor remained sound.

Embodiment 12

The same C/C material as in Embodiment 7 was used as a base member on the surface of which a SiC film having a thickness of about 30 μm was provided with a CVD method under the condition B in Table 2. Thereafter, like Embodiment 10 with a CVI method the cracks in the SiC covering layer were filled with SiC. On the surface, like Embodiment 10 a TiN covering layer having a thickness of about 5 μm was formed. Further, on the surface with the same method as above a SiC covering layer of about 30 μm was provided, and then with the CVI method the cracks were filled with SiC. Thus, the prepared covering layer of the present invention had substantially the same system as shown in the schematic cross section view in FIG.4g, substantially no cracks were observed on the TiN covering layer which was an intermediate layer in a three layered structure. Further as a result of the same durability test as in Embodiment 11, the weight reduction amount was substantially the same level as in Embodiment 11 and was slight.

Embodiment 13

A stainless steel (SUS304) was used as a base member, with the plasma flame spray method like Embodiment 3 an $Al_2O_3$ covering layer was formed. Further between the $Al_2O_3$ covering layer and the base member a Ni-Cr alloy layer having a thickness of about 50 $\mu$m was provided. The forming condition was the same as the alloy forming condition in Embodiment 3. On the surface the $Al_2O_3$ layer the thickness of about 50 $\mu$m was provided. The formation condition was such that by using powder of $Al_2O_3$ an Ar-H, plasma with an output of 50 kW was flame-sprayed. Thereafter the heat treatment thereof was carried out at a temperature of 950° C. under a vacuum of $10^{-4}$ Torr for 1 hour. As the result, turtle back shaped cracks having a crack channel width of 10~20 $\mu$m were formed on the $Al_2O_3$ covering layer.

Nextly with a sol-gel method, $Al_2O_3$ was filled in the cracks, in which treatment vacuum impregnation and heat treatment (heating at 900° C. under a vacuum of $10^{-4}$ Torr for 0.5 hour) were repeated 5 times. Thereafter, again on the surface under the above condition an $Al_2O_3$ covering layer having a thickness of about 50 $\mu$m was formed, and the same heat treatment and the sol-gel method treatment were applied. The thus prepared covering layer of the present invention had a similar system as that obtained by multilayering the covering layer of FIG.4b.

Durability test of this covering layer was carried out by using the insulation test equipment in molten salt as shown in FIG.15. In the drawing a base member 41 having a covering layer is sandwiched by electrode jigs 42, and in the space molten salt was sealingly filled and heated by a heater 44. A leakage current between the electrode jigs 42 and the base member 41 was measured with a circuit 45. The molten salt was 38% $K_2CO_3 + 62\% Li_2CO_3$ at a temperature of about 650° C., and the test piece provided with the covering layer of the present invention was exposed to this molten salt. Further, with the temperature of the test piece at about 650° C. an insulation property between the test piece and the supporting case (made of SUS 304) was examined. This durability evaluation simulated an insulating plate of a fuel cell using the molten salt. Further, for comparison, a test piece was prepared in which an $Al_2O_3$ covering layer of about 100 $\mu$m was provided on a Ni-Cr alloy layer. In this instance no heat treatment and no sol-gel method treatment were carried out. The test repeated 10 times of maintaining heating for 10 hours and cooling thereafter to a room temperature.

Figure 16:
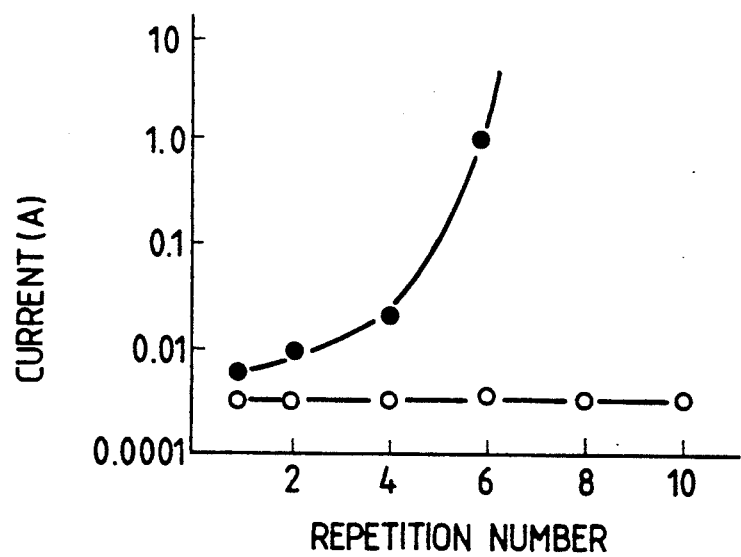
FIG.16 is a graph showing a test result of durability in the molten salt.

FIG.16 shows the result. As shown by white dots with the test pieces provided with the covering layer of the present invention no change of their insulation property was observed after the repetition of 10 times. On the other hand, with the comparison material after second cycle a reduction of insulation property appeared and after sixth cycle the measurement became difficult. As a result of cross section observation after the test, no damage was observed on the covering layer of the present invention, however, in the comparison material the covering layer wa peeled off.

As will be understood from the above, since an $Al_2O_3$ was filled into the cracks in the covering layer which were caused by a thermal expansion difference between the covering layer and the base member, no penetration of the molten salt occurred. On the other hand, in the comparison material penetration of the molten salt was induced through the cracks, and as the result reduction of insulation property was caused, and further because of corrosion at the interface between the covering layer and the alloy layer their adhesive force was considered reduced to lead the peeling off of the covering layer. Accordingly, the covering layer of the present invention maintains its excellent insulation property in environments such as in the molten salt.

The present invention has an advantage, in that, corrosion of a heat resistant member used under a high temperature corrosive environment is prevented for a long time.

What is claimed is:

1. A thermal land machine which comprises a heat resistant wall for confining a chamber; a heat resistant composite structure disposed in the chamber and in contact with a hot flowing gas of a temperature higher than 1500° C.; and means for introducing the hot gas toward the surface of the composite structure, wherein the composite structure comprises a heat resistant substrate and a continuous refractory coating formed on the substrate and made of a ceramic material, and wherein the refractory coating comprises at least two layers in a laminated structure each having fine cracks of a controlled width in the range of 0.5-50 $\mu$m substantially extended in the direction of the thickness of each of the layers and filled with a refractory material in such a manner that the filled cracks in one layer are disconnected with the filled cracks in the adjacent layer.

2. The thermal land machine according to claim 1, wherein an intermediate bonding layer is formed between the substrate and the refractory coating so as to increase the bonding strength of the coating to the substrate.

3. The thermal land machine according to claim 1, wherein the substrate is made of a sintered material comprising carbon fibers and carbon powder, which has an inclined density of the carbon fibers in the direction of the thickness of the substrate.

4. The thermal land machine according to claim 1, wherein the refractory filling material is of a ceramic material having a melting point higher than 1800° C. and is selected from the group consisting of carbides, nitrides and oxides of refractory metals.

5. The heat resistant composite structure according to claim 1, wherein the substrate is made of a sintered material comprising carbon fibers and carbon powder which has a non-homogenious arrangement of the carbon fibers in the direction of the thickness of the substrate so that the thermal expansion coefficients of the structure at both ends are different.

6. The heat resistant composite structure according to claim 1, wherein the refractory filling material is of a ceramic material having a melting point higher than 1700° C, and is selected from the group consisting of carbides, nitrides and oxides of refractory metals.

7. A thermal land machine comprising a heat resistant vessel for confining a hollow portion;
 a heat resistant composite structure disposed in the hollow portion and in contact with a hot gas flow of a temperature higher than 1200° C.; and
 a passage for conducting the hot gas flow toward a portion of a surface of the heat resistant composite structure,
 wherein the heat resistant composite structure comprises a heat resistant substrate and a continuous refractory coating having a thickness of at least 100

μm on an average formed on the heat resistant substrate and made of a ceramic material, and wherein at least two refractory layers are formed in the continuous refractory coating and each of the two layers has a thickness of at least 30 μm, and fine cracks of a controlled width in the range of 0.5-50 μm substantially in a direction of the thickness of the continuous refractory coating, the fine cracks being filled with a refractory filling material in such a manner that permeation of the hot gas flow into the heat resistant substrate is substantially prevented, wherein the fine cracks have been formed by heating the continuous refractory coating to a temperature higher than the temperature for forming the continuous coating, prior to the filling.

8. The thermal land machine according to claim 7, wherein an intermediate bonding layer is formed between the substrate and the refractory coating so as to increase the bonding strength of the coating to the substrate, the thickness of the intermediate layer being at least 30 μm.

9. The thermal land machine according to claim 7, wherein the substrate is made of a sintered material comprising carbon fibers and carbon powder, which has substantially a non-homogenious arrangement of the carbon fiber density in the direction of the thickness of the substrate.

10. The thermal land machine according to claim 7, wherein the refractory filling material is of a ceramic material having a melting point higher than 1700° C. and is selected from the group consisting of carbides or refractory metals, nitrides of refractory metals, and oxides of refractory metals.

11. A thermal land machine which comprises a heat resistant hollow member for confining a chamber; a heat resistant composite structure disposed in the chamber and in contact with a hot flowing gas of a temperature higher than 1700° C.; and means for introducing the hot gas toward a part of the surface of the heat resistant composite structure, wherein the composite structure comprises a heat resistant substrate and a continuous refractory coating formed on the substrate and made of a ceramic material, an wherein the refractory coating has a thickness of 50 to 100 μm and comprises at least two layers in a laminated structure each having a thickness of at least 30 μm and fine cracks of a controlled width in the range of 0.5-50 μm the direction of which is substantially extended in the direction of the distance of each of the layers, the cracks being filled with a refractory filling material in such a manner that permeation of the hot gas flow into the substrate is substantially prevented.

12. A thermal land machine comprising:
a heat resistant wall;
a heat resistant composite structure disposed on the heat resistant wall and in contact with a hot gas flow of a temperature higher than 1500° C.; and
means for directing the hot gas flow to contact a surface of the heat resistant composite structure,
wherein the heat resistant composite structure comprises a heat resistant substrate and a continuous refractory coating which is formed on the heat resistant substrate at an opposing side of the wall and is made of a ceramic material, and
wherein the refractory coating comprises at least two layers in a laminated structure, each of the two layers having fine cracks of a controlled width in the range of 0.5-50 μm substantially extended in a direction of the thickness of each of the two layers and filled with a refractory material in such a manner that a substantial portion of the filled cracks in one layer of the two layers are not continuous to a substantial portion of the filled cracks in another layer.

* * * * *